(12) United States Patent
Jenkins (10) Patent No.: US 10,730,747 B2
(45) Date of Patent: Aug. 4, 2020

(54) MEMS DEVICES AND PROCESSES

(71) Applicant: Cirrus Logic International Semiconductor Ltd., Edinburgh (GB)

(72) Inventor: Colin Robert Jenkins, Linlithgow (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/179,162

(22) Filed: Nov. 2, 2018

(65) Prior Publication Data

US 2020/0024134 A1   Jan. 23, 2020

Related U.S. Application Data

(60) Provisional application No. 62/583,585, filed on Nov. 9, 2017.

(30) Foreign Application Priority Data

Dec. 6, 2017   (GB) .................................. 1720324.1

(51) Int. Cl.
| | | |
|---|---|---|
| *B81C 1/00* | (2006.01) | |
| *B81B 3/00* | (2006.01) | |
| *H04R 19/00* | (2006.01) | |
| *H04R 19/04* | (2006.01) | |

(52) U.S. Cl.
CPC ........ *B81C 1/00158* (2013.01); *B81B 3/0021* (2013.01); *H04R 19/005* (2013.01); *H04R 19/04* (2013.01); *B81B 2201/0257* (2013.01); *B81B 2201/0264* (2013.01); *B81B 2203/04* (2013.01); *H04R 2201/003* (2013.01)

(58) Field of Classification Search
CPC .............. B81C 1/00158; B81B 3/0021; B81B 2201/0257; B81B 2201/0264; B81B 2203/04; H04R 19/005; H04R 19/04; H04R 2201/003
USPC ........................................................ 257/416
See application file for complete search history.

(56) References Cited

U.S. PATENT DOCUMENTS

| | | | | |
|---|---|---|---|---|
| 2010/0020991 | A1* | 1/2010 | Chen ..................... | B81B 3/0078 381/162 |
| 2010/0074458 | A1* | 3/2010 | Lan ...................... | H04R 19/005 381/150 |
| 2010/0212432 | A1* | 8/2010 | Kasai ................... | H04R 19/005 73/654 |
| 2011/0316100 | A1* | 12/2011 | Kim .................... | B81C 1/00158 257/416 |
| 2012/0090398 | A1* | 4/2012 | Lee ....................... | B81B 3/0072 73/715 |
| 2016/0167946 | A1 | 6/2016 | Jenkins et al. | |

OTHER PUBLICATIONS

Combined Search and Examination Report under Sections 17 and 18(3), UKIPO, Application No. 1720324.1, dated May 22, 2018.

* cited by examiner

*Primary Examiner* — Dzung Tran
(74) *Attorney, Agent, or Firm* — Jackson Walker L.L.P.

(57) ABSTRACT

The present application relates to MEMS transducer comprising a membrane electrode and a backplate electrode. The membrane electrode comprises primary and secondary openings.

19 Claims, 7 Drawing Sheets

MEMS DEVICES AND PROCESSES

TECHNICAL FIELD

This application relates to micro-electro-mechanical system (MEMS) devices and processes, and in particular to a MEMS device and process relating to a transducer, for example a capacitive microphone.

BACKGROUND INFORMATION

MEMS devices are becoming increasingly popular. MEMS transducers, and especially MEMS capacitive microphones, are increasingly being used in portable electronic devices such as mobile telephone and portable computing devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

Figure 1A:
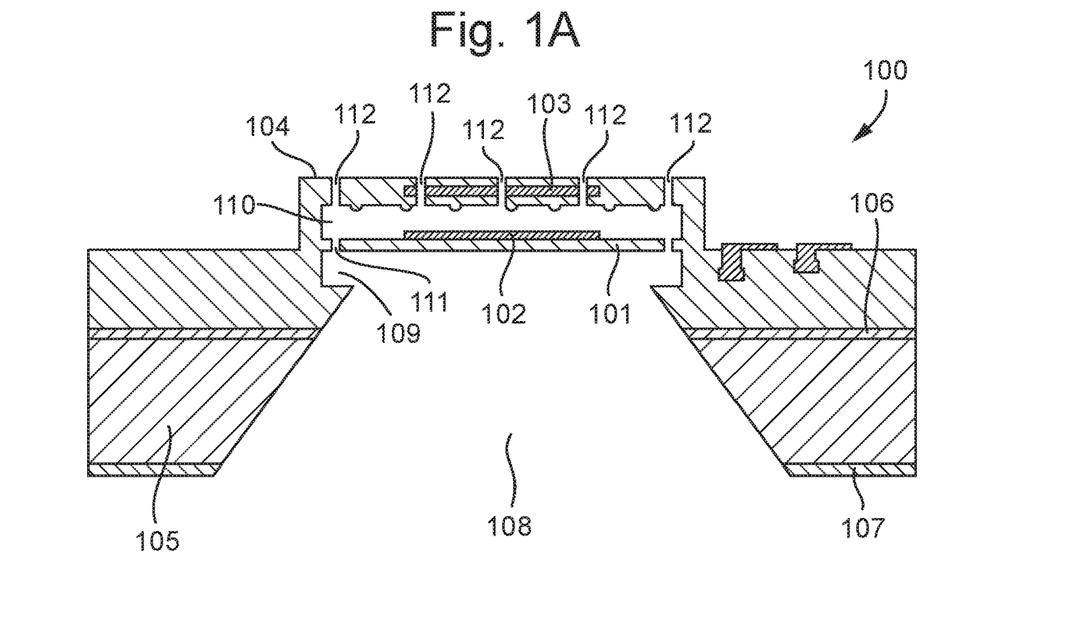
FIGS. 1a and 1b illustrate known capacitive MEMS transducers in section and perspective views.
Figure 1B:
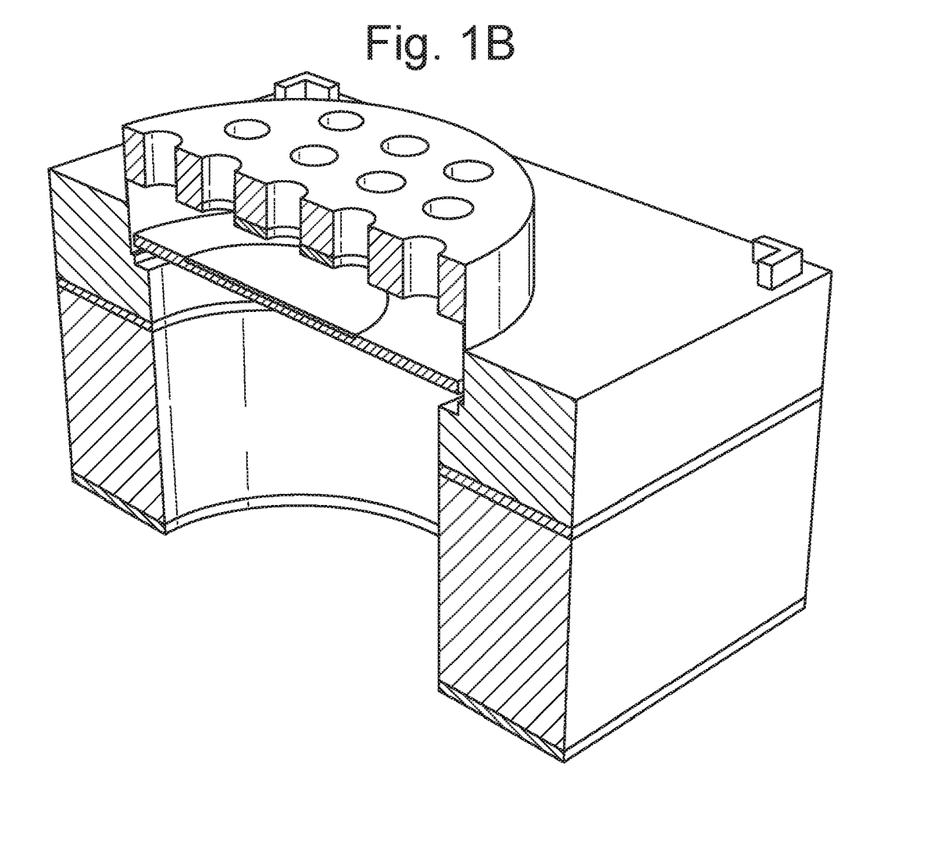

FIGS. 1A and 1B show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110. A plurality of holes, hereinafter referred to as bleed holes 111, connect the first cavity 109 and the second cavity 110.

A plurality of acoustic holes 12 are arranged in the back-plate 4 so as to allow free movement of air molecules through the back plate, such that the second cavity 10 forms part of an acoustic volume with a space on the other side of the back-plate. The membrane 11 is thus supported between two volumes, one volume comprising cavities 9 and substrate cavity 8 and another volume comprising cavity 11 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 4 forms part of the back-volume which is typically enclosed by some other structure, such as a suitable package.

It should also be noted that whilst FIGS. 1A and 1B shows the backplate being supported on the opposite side of the membrane to the substrate, arrangements are known where the backplate is formed closest to the substrate with the membrane layer supported above it.

In use, in response to a sound wave corresponding to a pressure wave incident on the microphone, the membrane is deformed slightly from its equilibrium or quiescent position. The distance between the membrane electrode 102 and the backplate electrode 103 is correspondingly altered, giving rise to a change in capacitance between the two electrodes that is subsequently detected by electronic circuitry (not shown).

The membrane layer and thus the flexible membrane of a MEMS transducer generally comprises a thin layer of a dielectric material—such as a layer of crystalline or polycrystalline material. The membrane layer may, in practice, be formed by several layers of material which are deposited in successive steps. Thus, the flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located in the centre of the flexible membrane 101, i.e. that part of the membrane which displaces the most. It will be appreciated by those skilled in the art that the membrane electrode may be formed by depositing a metal alloy such as aluminium-silicon for example. The membrane electrode may typically cover, for example, around 40% of area of the membrane, usually in the central region of the membrane.

Thus, known transducer membrane structures are composed of two layers of different material—typically a dielectric layer (e.g. SiN) and a conductive layer (e.g. AlSi).

Typically the membrane layer 101 and membrane electrode 102 may be fabricated so as to be substantially planar in the quiescent position, i.e. with no pressure differential across the membrane, as illustrated in FIG. 1a. The membrane layer may be formed so as to be substantially parallel to the back-plate layer in this quiescent position, so that the membrane electrode 102 is parallel to the back-plate electrode 103. However, over time, the membrane structure may become deformed—e.g. as a consequence of relatively high or repeated displacement—so that it will not return to exactly the same starting position.

It will be appreciated that both the membrane and the membrane electrode will suffer intrinsic mechanical stress after manufacture. The composite membrane and membrane electrode structure is typically formed by deposition which takes place at high temperatures of around a few hundred degrees Celsius. On return to room temperature, and as a consequence of the membrane and membrane electrode having greatly different thermal coefficients of expansion, the two layers contract by different amounts. Since the two layers are intimately mechanically coupled together, thus preventing the dissipation of stress by independent mechanical contraction, thermal induced mechanical stress arises within the layers of the membrane and membrane electrode structure. Thus, even at equilibrium (when the pressure differential across the membrane is substantially zero) the composite structure will tend to deform as a result of the thermal induced stress. This is similar to the well-known operation of bi-metallic strip thermostat sensors.

Figure 2:
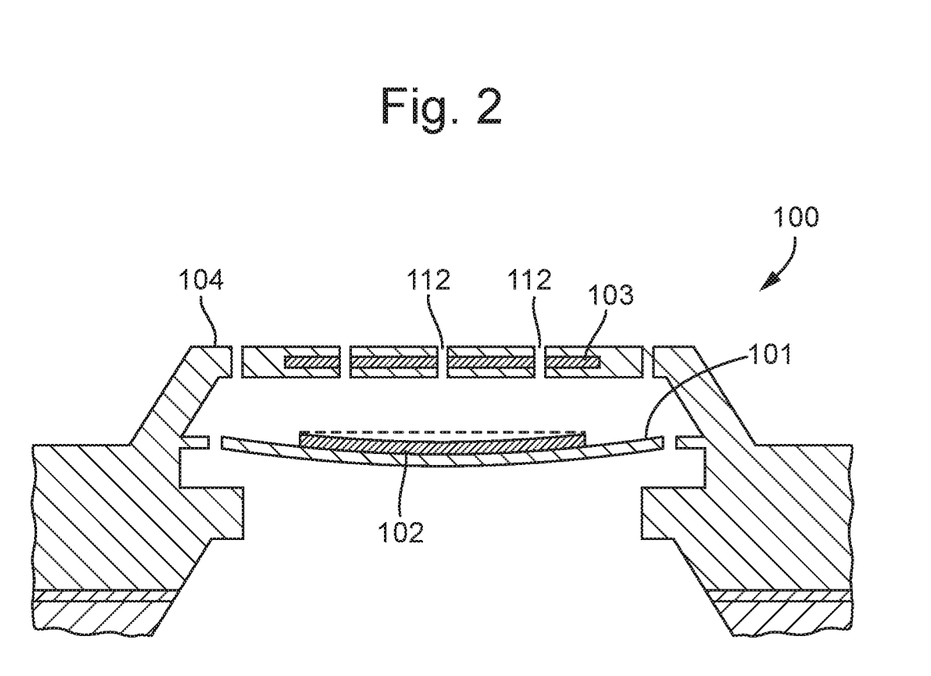
FIG. 2 illustrates how a membrane may be deformed.

FIG. 2 illustrates the permanent deformation which can occur to the quiescent position of the membrane 101/102. It can be seen that the quiescent position of the membrane, and thus the spacing between the back-plate electrode 103 and the membrane electrode 102, changes from its position immediately after manufacture—shown by the dashed line—to the deformed quiescent position. This can lead to a DC offset in the measurement signal from such a transducer, as the capacitance at the quiescent position is not the same. Furthermore, for a.c. audio signals, the change in capacitance leads to a variation in the signal charge for a given acoustic stimulus, i.e. the acousto-electrical sensitivity of the microphone. This change in capacitance is sometimes referred to as reflow drift or plastic deformation.

The problem of reflow drift was considered in an earlier application filed by the present Applicant. Specifically, a MEMS transducer was disclosed in which the membrane electrode comprises at least one opening, wherein at least part of the area of the opening corresponds to the area of a back-plate hole in a direction normal to the membrane. In other words the area of at least part of the opening in the membrane electrode aligns (in a direction normal to the membrane) with at least part of the area of a back-plate hole. By providing such openings in the membrane electrode, the total amount of metal forming the membrane electrode can be reduced compared to a membrane electrode having a similar diameter but without any such openings. As a consequence, the reflow drift or metal creep that is demonstrated by the membrane and membrane electrode structure, and which is proportional to the area of metal provided on the surface of the membrane, is mitigated.

Figure 3A:
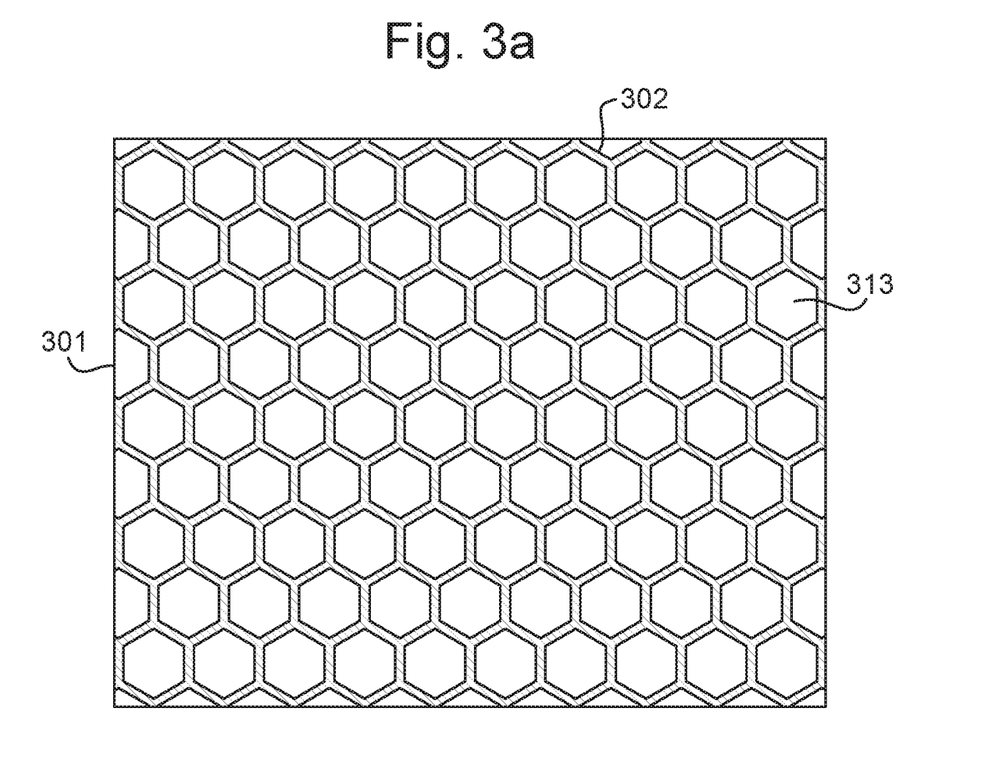
FIG. 3a illustrates a plan view of a previously considered membrane electrode structure that is patterned to incorporate openings.
Figure 3B:
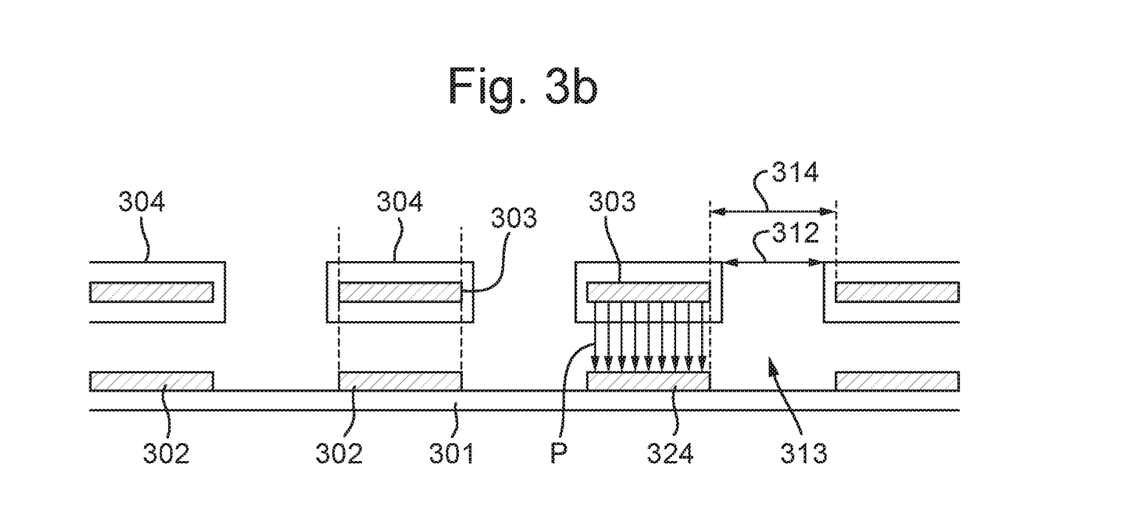
FIG. 3b illustrates a cross section through a membrane electrode structure that is patterned to incorporate openings.

FIG. 3a illustrates a plan view of such a previously proposed MEMS transducer comprising a membrane electrode 302 formed on a flexible membrane 301. The membrane electrode 302 has a plurality of openings 313 in the electrode material 302 where there is no coverage of the membrane 301. FIG. 3b illustrates a part of a cross-section of the previously proposed transducer illustrated in FIG. 3a and additionally illustrates the backplate structure 304 in a plane above the membrane and membrane electrode structure. The backplate structure comprises a back-plate electrode 303. Acoustic holes 312 are provided through the backplate structure. These acoustic holes 312 allow acoustic communication between the cavity that is provided between the membrane and backplate and a volume on the other side of the membrane (which could be a sound port or a back-volume). The backplate electrode 303 is patterned to provide holes 314 which correspond to the acoustic holes. The advantage of designing the membrane electrode to include openings 313—or regions devoid of membrane electrode material—is that less membrane electrode material is provided on the flexible membrane and thus the area of interface between the membrane and the membrane electrode material is less than in the case of a continuous sheet electrode design. This reduces the effect of the thermal induced stress between the layers and, consequently, the membrane and membrane electrode structure is less susceptible to plastic deformation.

Although transducers comprising a patterned electrode are less susceptible to reflow drift, membrane and membrane electrode structures may still be prone to some degree of plastic deformation.

The present disclosure invention relates to MEMS transducers and processes which seek to further alleviate the occurrence of reflow drift.

SUMMARY OF EMBODIMENTS

According to an example embodiment of a first aspect there is provided a MEMS transducer comprising:
a flexible membrane;
a layer of conductive material provided on a first surface of the flexible membrane to form a membrane electrode, the layer of conductive material comprising a plurality of primary openings;
wherein an intermediate section of conductive material is defined between first and second adjacent primary openings, and wherein said intermediate section of conductive material is provided with a secondary opening.

Thus, the layer of conductive material may form a membrane electrode of the transducer. The layer of conductive material can be considered to be patterned to define a grid or lattice comprising a plurality of primary openings. The primary openings may be substantially the same size. Alternatively, the size of the primary openings may vary—for example between a central region of the membrane electrode and a peripheral region of the membrane electrode. The primary openings may be any shape including square, circular or hexagonal. According to one or more preferred examples, the primary openings are regular polygons, for example hexagons.

By considering two adjacent primary openings, it will be appreciated that an intermediate section of conductive material is defined between them. The shape of this section of conductive material will depend on the shape of the openings. For example, in the case of primary openings which define a closed shape comprising a plurality of straight edges, such as a hexagon, the intermediate section of conductive material may be considered to be a longitudinal or elongate beam.

It will be appreciated that a notional line drawn between the centres of first and second adjacent primary openings will intersect the intermediate section of conductive material that is between them. The width of the intermediate section can be considered to correspond to the length of the portion of the notional line that intersects the intermediate section of conductive material.

The secondary opening may define a closed shape, such as a circle, oval, rectangle or elliptical shape. Since the intermediate section of conductive material that is defined between first and second adjacent primary openings may exhibit an elongate shape, it may be efficient for the secondary opening to also exhibit an elongate shape. Thus, the secondary opening may be considered to have a longitudinal axis that is substantially aligned with a longitudinal axis of the intermediate section of conductive material. Thus, the longitudinal axis may extend in a direction substantially orthogonal to the notional line.

According to an example embodiment of a second aspect, there is provided a MEMS transducer comprising:
a membrane electrode comprising a plurality of openings;

a backplate electrode provided in a plane above the membrane and comprising a plurality of holes;
wherein each hole in the backplate electrode is at least partly aligned with a corresponding opening in the membrane electrode,
wherein the membrane electrode comprises a secondary opening which underlies an intermediate section of conductive material formed between two adjacent holes in the backplate electrode.

According to an example embodiment of a third aspect there is provided a MEMS transducer comprising:
a flexible membrane comprising a membrane electrode;
wherein the membrane electrode comprises a plurality of primary openings and a plurality of secondary openings wherein said secondary openings are between said primary openings.

According to an example embodiment of a fourth aspect there is provided a MEMS transducer comprising:
a flexible membrane comprising a membrane electrode comprising a plurality of primary and secondary openings wherein said secondary openings are between said primary openings.

According to an example embodiment of a further aspect there is provided a flexible membrane for use in a MEMS transducer comprising a membrane electrode comprising a plurality of primary and secondary openings wherein said secondary openings are between said primary openings.

Features of any given aspect may be combined with the features of any other aspect and the various features described herein may be implemented in any combination in a given embodiment.

Associated methods of fabricating a MEMS transducer are provided for each of the above aspects and examples described herein.

BRIEF DESCRIPTION OF THE DRAWINGS

For a better understanding of the present invention and to show how the same may be carried into effect, reference will now be made, by way of example, the accompanying drawings in which.

The drawings are provided for illustrative purposes only and are not to scale.

DETAILED DESCRIPTION

Figure 4:
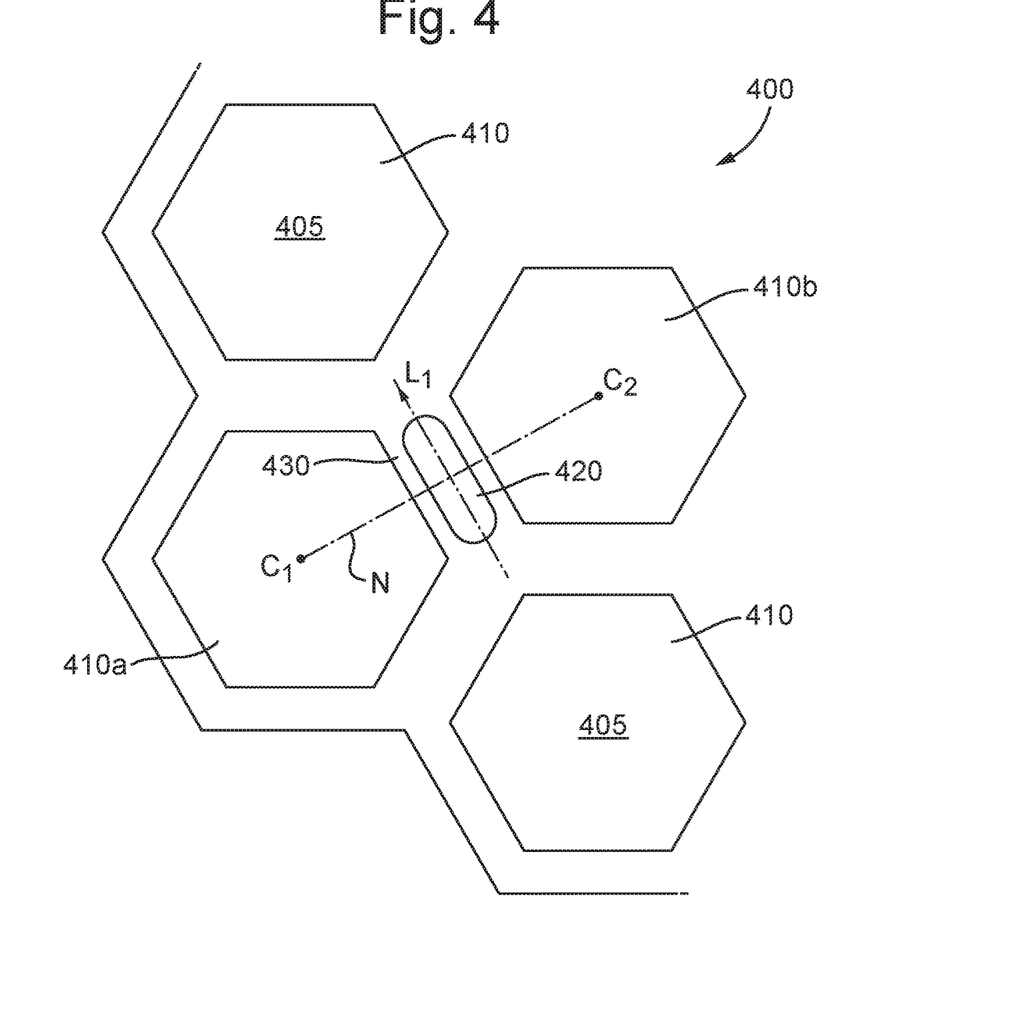
FIG. 4 illustrates a part of a conductive layer of a membrane electrode according to a first example.

FIG. 4 illustrates a part of a conductive layer 400 of a membrane electrode according to a first example. The membrane electrode comprises a plurality of primary openings 410 which, in this example, are substantially hexagonal in shape. The conductive layer is formed on the surface of a layer of membrane material 405 which forms a flexible membrane. The conductive layer also includes a secondary opening 420. The secondary opening 420 is provided in an intermediate section of conductive material 430 which extends between first and second adjacent primary openings.

As illustrated in FIG. 4, a notional line N drawn between the centre $C_1$ of the first primary opening and the centre $C_2$ of the adjacent, second primary opening intersects the intermediate section of conductive material 430 that is between the first and second primary openings. In this example, the intermediate section of conductive material 430 which extends between the adjacent primary openings defines an elongate beam having a longitudinal axis $L_1$. Furthermore, in this example the secondary opening 420 is generally elongate in shape. A longitudinal axis of the secondary axis is substantially aligned with, or parallel to, the longitudinal axis of the intermediate section of conductive material. It will also be appreciated that the longitudinal axis of the secondary opening extends in a direction that is substantially orthogonal to the notional line N.

According to example embodiments described herein the provision of a secondary opening in the region of an intermediate section of conductive material beneficially reduces the amount of metal forming the membrane electrode. As a consequence, the reflow drift or metal creep that is demonstrated by the membrane and membrane electrode structure, and which is proportional to the area of metal provided on the surface of the membrane, is mitigated.

In this example, the intermediate section of conductive material that is defined between adjacent straight edges of the hexagonal primary openings is generally rectangular in shape. However, it will be appreciated that the present embodiments extend to examples in which the layer of conductive material is patterned with a plurality of primary openings which may be any shape, including regular or irregular polygons or circular, and that the shape of the intermediate section of conductive material that is defined between adjacent openings depends on the shape of the openings and the spacing between the openings.

Furthermore, the shape and size of the secondary opening may be selected or optimised depending on the size and shape of the intermediate section of conductive material that is defined between adjacent primary openings. Bearing in mind the desire to reduce the interface area between the layer of conductive material and the underlying layer of membrane material, it may be beneficial for the secondary opening to occupy at least 75% of the area of the intermediate section of conductive material that would be present without the provision of the secondary opening.

The secondary opening may be any shape, including rectangular, elliptical or oval. It is also envisaged that a plurality of secondary openings may be provided within a single intermediate section of conductive material. However, this would be more difficult to engineer and fabricate.

Figure 5:
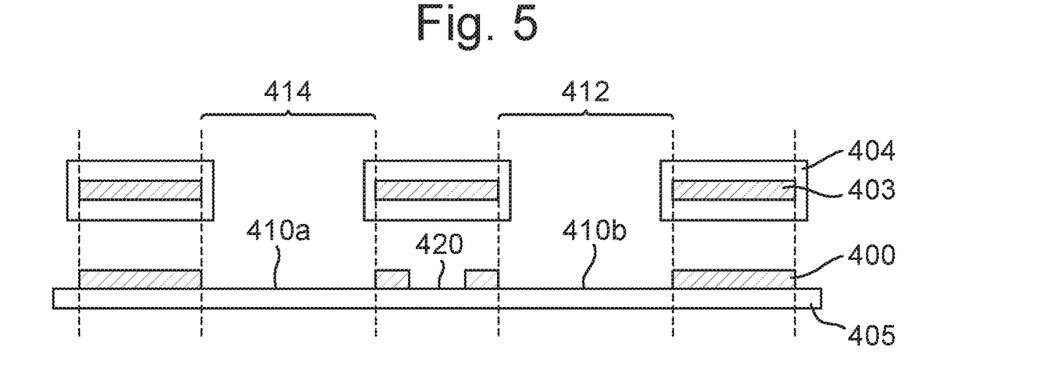
FIG. 5 illustrates a part of a cross-section of the membrane and membrane electrode structure illustrated in FIG. 4.

FIG. 5 shows a part of a cross-section of the membrane and membrane electrode structure illustrated in FIG. 4, and additionally illustrates a backplate structure 404 in a plane above the membrane and membrane electrode structure. The backplate structure comprises a back-plate electrode 403. Acoustic holes 412 are provided through the backplate structure. These acoustic holes 412 allow acoustic communication between the cavity that is provided between the membrane and backplate and a volume on the other side of the membrane (which could be a sound port or a back-volume). The backplate electrode 403 is patterned to provide holes 414 which correspond to the acoustic holes.

The cross section illustrated in FIG. 5 is taken along an extension of the notional line N. It can be appreciated that the primary openings underlie a corresponding hole in the backplate electrode. In this example, it will be appreciated from consideration of the vertical dotted lines shown on FIG. 5, that the edge or perimeter of a given primary opening formed in the membrane electrode maps onto the corresponding edge or perimeter of the overlying hole in the backplate layer.

In one or more examples the area of a given primary opening substantially corresponds to the area of the corresponding hole in the backplate electrode. Thus, the shape and size of the primary opening in the membrane electrode is substantially the same shape and size as the corresponding hole in the backplate electrode.

As one skilled in the art will appreciate, and as illustrated in FIG. 3b, in a parallel plate capacitor which is charged/biased there will be an electrostatic field component P running from one plate to the other in a direction perpendicular to the plates. However in the areas of the acoustic holes there is no back-plate electrode and thus no perpendicular field component. As shown in FIG. 3b, the openings in the membrane electrode are beneficially located so as to substantially correspond, or at least partially underlie, the holes in the back-plate electrode. It will be appreciated that in areas directly underlying the backplate electrode holes there will be no perpendicular field component, even if there were membrane electrode material present, because of the absence of back-plate electrode. Thus, based on a simple analysis of the perpendicular field component of the electrostatic field that arises between the areas of the electrodes that are mutually parallel, the provision of openings in the membrane electrode in areas that directly underlie (i.e. areas within the membrane electrode layer that intersect a line drawn normal to backplate electrode hole) may be expected to have only a limited impact on the resulting capacitance of the sensor and hence on sensitivity of the sensor.

However, somewhat surprisingly, measurements of the capacitance arising between the membrane and backplate electrode according to such prior examples have demonstrated that the capacitance tends to change, i.e. increase, over time from an initial time $t_0$. In other words, although the permanent change in capacitance caused by the plastic deformation of the two-layer structure is mitigated by the reduction in metal area, a time-dependent drift in sensitivity may occur.

Figure 6:
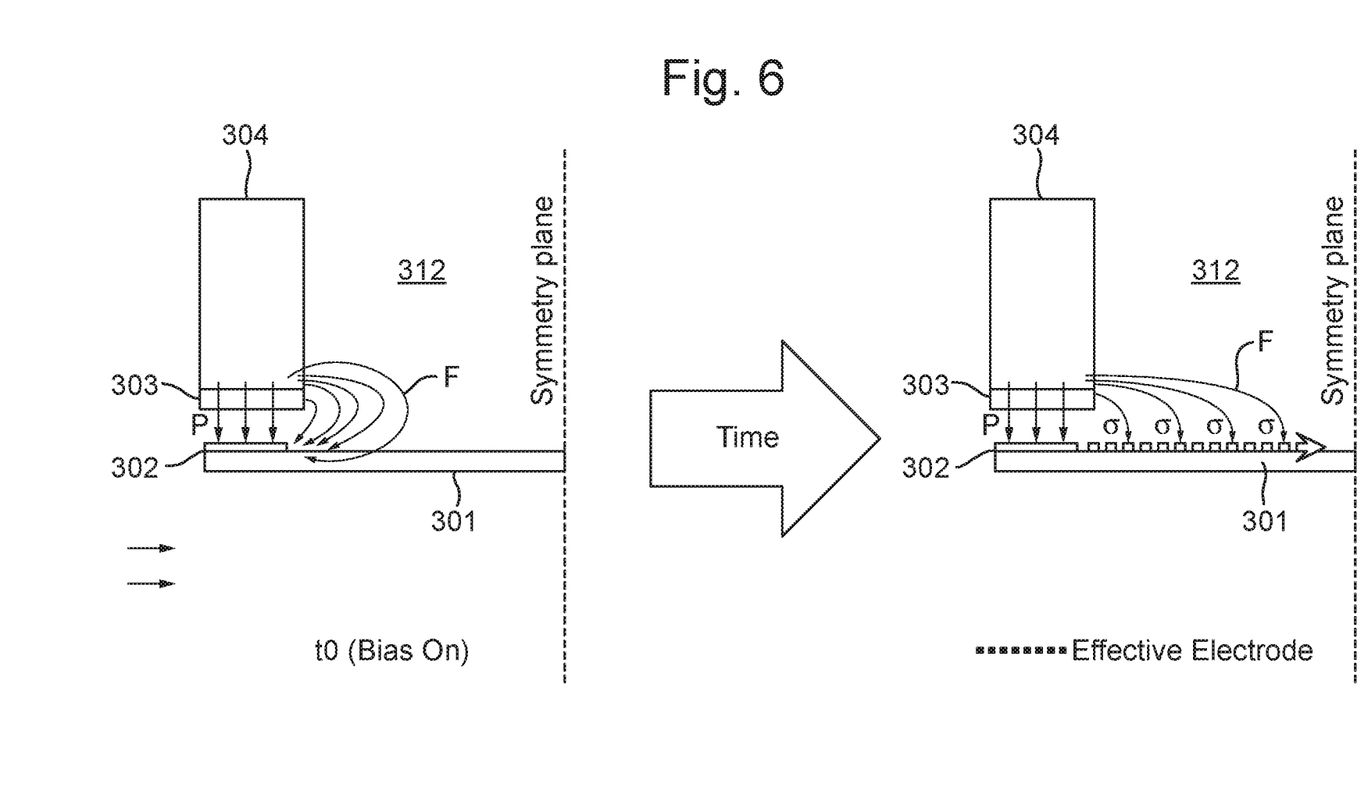
FIG. 6 illustrates the electrostatic field lines arising between a backplate electrode and a membrane electrode of a MEMS transducer.

To understand why this dynamic drift in capacitance may arise, it is useful to consider a more complete analysis of the electrostatic fields arising in the airgap between the electrodes. In particular, as illustrated in FIG. 6, the present inventors have considered the effect of non-perpendicular fringing electrostatic fields F that extend from the edge of the backplate electrode (nearest the hole in the back-plate) to the edge of the underlying membrane electrode. Such fringing fields F may make a contribution to the capacitance and thus the sensitivity of the microphone. At an initial time, $t_0$, such fringing fields may only extend, i.e. bow, laterally for about 1-2 µm whilst the diameter of the electrode holes may be larger, for example of the order of about 1.0 µm or so in diameter. Thus, it has been generally understood that the contribution of the electrostatic fringing fields is relatively minimal.

As previously mentioned, the membrane of a MEMS transducer generally comprises a thin layer of a dielectric material, e.g. silicon or silicon nitride (SiN). Thus, in devoid membrane electrode regions corresponding to each of the openings in the membrane electrode, an area of underlying membrane material is exposed. It is hypothesised by the present inventors that unpassivated dangling bonds on the surface of this exposed membrane layer form electrically active charge traps and, thus, surface charges a start to diffuse from the perimeter of the conductive electrode on the exposed areas of the flexible membrane material. It is further hypothesised that moisture present on the exposed surface may play a role in this charge diffusion. Furthermore, these surface charges a are thought to gradually build up, effectively extending the membrane electrode into the region of the opening. The surface charges therefore contribute dynamically to the overall capacitance—and thus the sensitivity—of the transducer. It is therefore thought that the presence of exposed regions of membrane dielectric material may potentially give rise to a secondary drift mechanism (sometimes referred to as "power-on" drift) in examples of MEMS transducers which utilise a membrane electrode that is patterned to incorporate a plurality of openings.

One or more example embodiments may further seek to alleviate the occurrence of such a time-dependent sensitivity (or power-on) drift, by providing a transducer which exhibits has a reduced plastic deformation as compared to sheet electrode designs but which also demonstrate a more stable sensitivity or performance over time.

Figure 7:
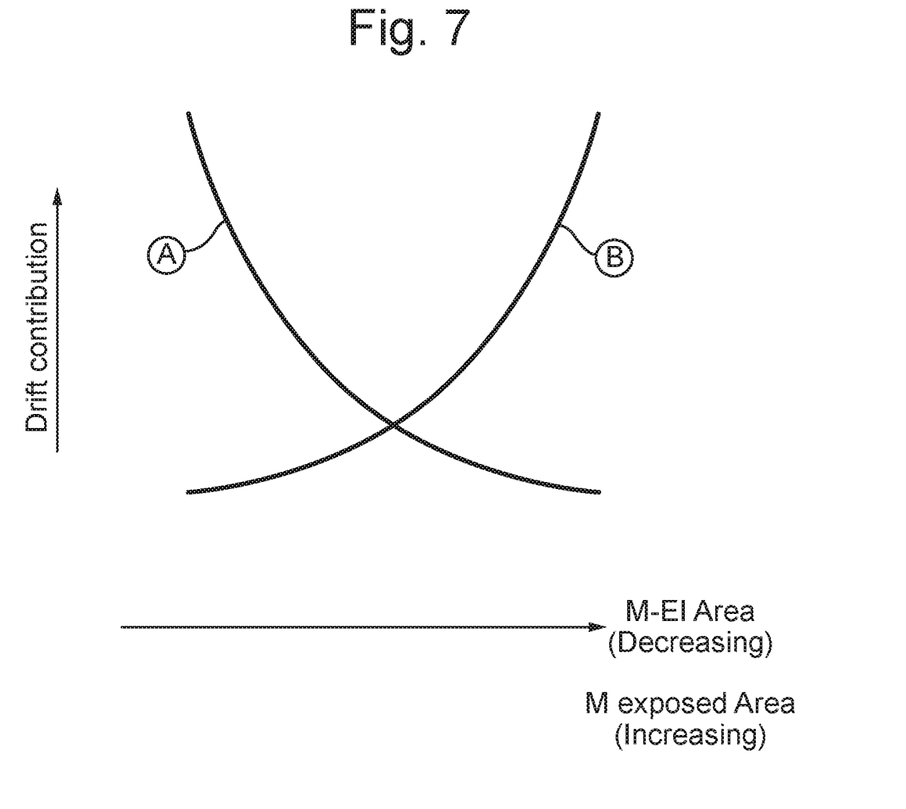
FIG. 7 provides two separate plots to illustrate the drift in capacitance due to plastic deformation of the membrane structure and accumulating surface charges on the exposed regions of the membrane layer.

FIG. 7 provides two separate plots to illustrate, relative to a decreasing membrane electrode area (and thus increasing exposed membrane area), the contribution of the drift in capacitance that arises due to plastic deformation of the membrane structure (plot A) and the contribution of the (time-dependent) power-on drift in capacitance that arises due to, it is hypothesised, surface charges arising on the exposed regions of the membrane layer (plot B).

One or more example embodiments described herein seek to provide a MEMS transducer having a modified membrane electrode that is preferably designed having regard for these two, competing, drift mechanisms. In particular, examples described herein seek to provide a MEMS transducer which seeks to mutually reduce the drift in capacitance due to the thermally induced plastic deformation that is induced at the time of fabrication, as well as seeking to minimise the drift in capacitance that arises due to the build-up of surface charges on the exposed regions on the membrane layer during operation.

Figure 8:
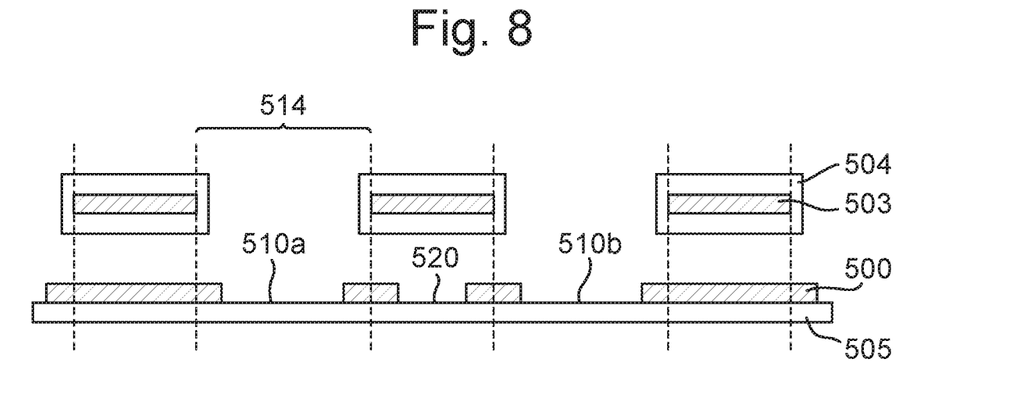
FIG. 8 shows a part of a cross-section of a MEMS transducer comprising a membrane electrode according to a further example embodiment.

FIG. 8 shows a part of a cross-section of a MEMS transducer comprising a membrane 505 and a membrane electrode 500 according to a further example embodiment. A backplate structure 504 is provided in a plane above the membrane electrode structure. The backplate structure comprises a back-plate electrode 503 which is patterned to provide holes 514 which correspond to the acoustic holes formed in the backplate structure. The membrane electrode comprises first and second primary openings 510a and 510b. In this example, the primary openings are smaller than the overlying holes in the backplate electrode such that the perimeter of a given primary opening in the membrane electrode falls inside the overlying backplate hole when projected into the plane of the backplate electrode. Thus, when the primary opening is projected into the plane of the backplate electrode, then the area of the primary opening is within the area of the corresponding (overlying) backplate electrode hole. Thus, the width of the primary opening as illustrated by the cross-section shown in FIG. 8 is smaller than the width of the corresponding backplate hole.

The arrangement shown in FIG. 8, whereby the hole in the backplate electrode overlaps the perimeter of corresponding primary opening in the membrane electrode, has consequences for the capacitance (and thus the sensitivity) of the transducer. In particular, by increasing the area of the conductive material relative to the overlying backplate electrode, more parallel electric fields arise between the corresponding intermediate sections of conductive material.

Furthermore, the time-dependent drift in capacitance that was discussed above with reference to FIG. 6, which arises due to the build-up of charge on the exposed surface of the membrane (in the region of the primary openings), is alleviated. This can be appreciated by considering the diffusion length of the surface charges and the fact that the surface charges will gradually diffuse onto the exposed surface of the membrane inwardly from the conductive material which forms the perimeter of the primary opening. By reducing the distance from one edge of the opening to the opposite edge of the opening, the distance that the charges need to diffuse across the opening in order to cover the exposed surface is reduced. Thus, one or more example embodiments, such as that illustrated in FIG. 8, may be advantageously designed such that the surface charging that arises on exposed regions of the membrane accumulates and/or stabilises more quickly. The resultant electric field is more closely similar to the field pattern that would arise in the case of a continuous sheet electrode (i.e. without openings).

The membrane electrode illustrated in FIG. 8 further comprises a secondary opening 520 which is formed in the intermediate section or beam of conductive material that is defined between the adjacent first and second primary openings 510*a* and 510*b*. The provision of the secondary opening 520 beneficially reduces the amount of metal that is contact with the underlying membrane layer.

Having regard for the plot shown in FIG. 7, it will be appreciated that there is a trade-off between the reflow drift and the power-on drift. Thus, although the reduction in the width/area of the primary opening relative to the corresponding hole in the backplate electrode alleviates the problem of a time-dependent, power-on drift in capacitance, the additional amount of metal on the surface may exacerbate the issues of reflow drift. However, according to the FIG. 8 example the provision of the secondary opening— which reduces the interface area between the membrane electrode and the membrane layer—at least partially compensates for the increase in interface area.

It will be appreciated that it may be beneficial for the membrane electrode to be provided with a plurality of secondary openings in order to significantly reduce the coverage of the u=membrane layer with the conductive material and therefore reduce the plastic deformation of the membrane and membrane structure. The plurality of secondary openings may for example, be provided at relative intervals relative to the outer perimeter of a given opening. In the case of a primary openings which is a polygon, the plurality of secondary openings may be arranged with respect to each of the perimeter edges of the primary opening. For example, the case of a membrane electrode which comprises a hexagonal lattice of primary openings, a secondary opening may be provided relative to each of the six edges of the primary openings.

Figure 9:
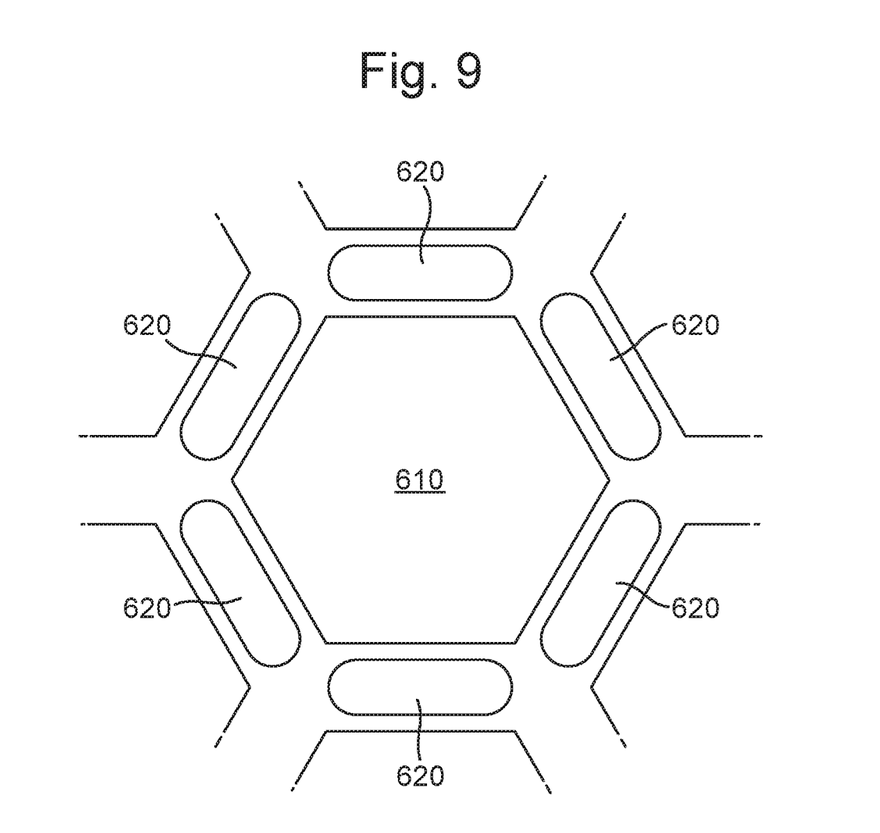
FIG. 9 shows a part of a membrane electrode according to a further example.

FIG. 9 shows a part of a membrane electrode according to a further example. The membrane electrode comprises a central primary opening 610 and a plurality of primary openings 610 arranged relative to each of the straight edges of the central primary opening. The membrane electrode further comprises a plurality of secondary openings 620. The primary openings are hexagonal in shape and each of the secondary openings is provided in an intermediate section of conductive material that is defined between a straight perimeter edge of the central primary opening and a straight perimeter edge of each adjacent primary opening. Thus, the intermediate sections of conductive material can be considered to be a beam having a generally rectangular shape, wherein the long edges of the rectangular beam are defined by adjacent straight perimeter edges of adjacent primary openings.

The MEMS transducer will typically comprise a substrate, wherein the flexible membrane is supported relative to the substrate. A cavity may be provided through the substrate, similar to the arrangement illustrated in FIGS. 1*a* and 1*b*. It will be appreciated that the pattern illustrated in FIG. 9 may be repeated across the majority of the membrane electrode or may be provided only at one or more regions of the membrane electrode, for example at the central region of the membrane electrode, which may overly the substrate cavity of the transducer.

A transducer comprising a membrane electrode according to examples of the present embodiments will preferably be provided with a backplate structure which supports a backplate electrode. As previously discussed, the backplate and backplate electrode are provided with acoustic holes to allow free movement of air molecules through the back plate. According to preferred examples of the present embodiments, the location of the acoustic holes in the back-plate and the back-plate electrode correspond to the location of the openings in the membrane electrode (or vice versa). By correspond it is meant that the position of the centre of the openings in the membrane will be substantially the same as the position of the centre of the holes in the back-plate electrode as viewed from a direction normal to the membrane (or back-plate electrode). Therefore were the acoustic holes of the backplate electrode to be projected onto the membrane electrode in such a direction, then the centres of the backplate holes would coincide or at least nearly coincide with the centre of the openings in the membrane electrode.

The membrane electrode is typically a thin layer of metal, e.g. aluminium, which is typically located in the centre of the flexible membrane, i.e. that part of the membrane which displaces the most. It will be appreciated by those skilled in the art that the membrane electrode may be formed by depositing a metal such as aluminium or a metal alloy such as aluminium-silicon for example. The membrane electrode may typically cover, for example, around 40% of area of the membrane, usually in the central region of the membrane.

The backplate electrode—which is typically a thin layer of metal e.g. aluminium—may be embedded within a backplate structure of the MEMS transducer. Thus, the backplate may be formed of a plurality of backplate layers wherein a metal layer which forms the backplate electrode is sandwiched between two adjacent layers.

The flexible membrane may comprise a crystalline or polycrystalline material, such as one or more layers of silicon-nitride $Si_3N_4$.

MEMS transducers according to the present examples will typically be associated with circuitry for processing an electrical signal generated as a result of detected movement of the flexible membrane, either by a capacitive sensing technique or by an optical sensing technique. Thus, in order to process an electrical output signal from the microphone, the transducer die/device may have circuit regions that are integrally fabricated using standard CMOS processes on the transducer substrate.

The circuit regions may be fabricated in the CMOS silicon substrate using standard processing techniques such as ion implantation, photomasking, metal deposition and etching. The circuit regions may comprise any circuit operable to interface with a MEMS transducer and process associated signals. For example, one circuit region may be a pre-amplifier connected so as to amplify an output signal from the transducer. In addition another circuit region may be a charge-pump that is used to generate a bias, for example 12 volts, across the two electrodes. This has the effect that changes in the electrode separation (i.e. the capacitive plates of the microphone) change the MEMS microphone capacitance; assuming constant charge, the voltage across the electrodes is correspondingly changed. A pre-amplifier, preferably having high impedance, is used to detect such a change in voltage.

The circuit regions may optionally comprise an analogue-to-digital converter (ADC) to convert the output signal of the microphone or an output signal of the pre-amplifier into a corresponding digital signal, and optionally a digital signal processor to process or part-process such a digital signal. Furthermore, the circuit regions may also comprise a digital-to-analogue converter (DAC) and/or a transmitter/receiver suitable for wireless communication. However, it will be appreciated by one skilled in the art that many other circuit arrangements operable to interface with a MEMS transducer signal and/or associated signals, may be envisaged.

It will also be appreciated that, alternatively, the microphone device may be a hybrid device (for example whereby the electronic circuitry is totally located on a separate integrated circuit, or whereby the electronic circuitry is partly located on the same device as the microphone and partly located on a separate integrated circuit) or a monolithic device (for example whereby the electronic circuitry is fully integrated within the same integrated circuit as the microphone).

Examples described herein may be usefully implemented in a range of different material systems, however the examples described herein are particularly advantageous for MEMS transducers having membrane layers comprising silicon nitride.

One or more MEMS transducers according to the examples described here may be located within a package. This package may have one or more sound ports. A MEMS transducer according to the examples described here may be located within a package together with a separate integrated circuit comprising readout circuitry which may comprise analogue and/or digital circuitry such as a low-noise amplifier, voltage reference and charge pump for providing higher-voltage bias, analogue-to-digital conversion or output digital interface or more complex analogue or digital signal processing.

A MEMS transducer according to the examples described here may be located within a package having a sound port.

It is noted that the example embodiments described above may be used in a range of devices, including, but not limited to: analogue microphones, digital microphones, pressure sensor or ultrasonic transducers. The example embodiments may also be used in a number of applications, including, but not limited to, consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment. Associated methods of fabricating a MEMS transducer are provided for each of the example embodiments.

It should be understood that the various relative terms above, below, upper, lower, top, bottom, underside, overlying, underlying, beneath, etc. that are used in the present description should not be in any way construed as limiting to any particular orientation of the transducer during any fabrication step and/or it orientation in any package, or indeed the orientation of the package in any apparatus. Thus the relative terms shall be construed accordingly.

In the examples described above it is noted that references to a transducer may comprise various forms of transducer element. For example, a transducer may be typically mounted on a die and may comprise a single membrane and back-plate combination. In another example a transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising:
   a flexible membrane;
   a layer of conductive material provided on a first surface of the flexible membrane to form a membrane electrode, the layer of conductive material comprising a plurality of primary openings;
   wherein an intermediate section of conductive material is defined between first and second adjacent primary openings, and wherein said intermediate section of conductive material is provided with a secondary opening;
   a backplate comprising a backplate electrode, the backplate electrode having a plurality of holes;
   wherein each primary opening formed in the membrane electrode at least partially underlies a corresponding hole in the backplate electrode and wherein the secondary opening at least partially underlies a corresponding intermediate section of conductive material provided between first and second adjacent holes of a backplate electrode.

2. A MEMS transducer as claimed in claim 1, wherein a notional line drawn between the centres of the first and second adjacent primary openings intersects the intermediate section of conductive material that is between them.

3. A MEMS transducer as claimed in claim 1, wherein the intermediate section of conductive material comprises an elongate beam having a longitudinal axis.

4. A MEMS transducer as claimed in claim 1, wherein the secondary opening defines an elongate shape having a longitudinal axis.

5. A MEMS transducer as claimed in claim 3, wherein the secondary opening defines an elongate shape having a longitudinal axis, and wherein the longitudinal axis of the secondary opening is substantially aligned with, or parallel to, the longitudinal axis of the intermediate section of conductive material.

6. A MEMS transducer as claimed in claim 2, wherein the secondary opening defines an elongate shape having a longitudinal axis, and wherein the longitudinal axis of the secondary opening extends in a direction that is substantially orthogonal to the notional line.

7. A MEMS transducer as claimed in claim 1, wherein the area of said primary opening formed in the membrane electrode substantially corresponds to the area of the corresponding hole in the backplate electrode.

8. A MEMS transducer as claimed in claim 1, wherein one or more of the shape and size of said primary opening in the membrane electrode is substantially the same shape and size respectively as the corresponding hole in the backplate electrode.

9. A MEMS transducer as claimed in claim 1, wherein the perimeter of the backplate hole substantially maps onto the perimeter of the corresponding primary opening in the membrane electrode when projected onto the plane of the membrane electrode in a direction normal to the membrane.

10. A MEMS transducer as claimed in claim 1, wherein when a given hole in the backplate electrode is projected onto the plane of the membrane electrode in a direction normal to the backplate electrode, an area of the corresponding opening in the membrane electrode is within the area of the hole.

11. A MEMS transducer as claimed in claim 1, wherein a first width of a given primary opening in the membrane electrode is smaller than a second width of the corresponding hole in the backplate electrode.

12. A MEMS transducer as claimed in claim 1, wherein a plurality of secondary openings are provided around one said primary opening, each secondary opening being provided in an intermediate section of conductive material that is between said primary opening and an adjacent primary opening.

13. A MEMS transducer as claimed in claim 1, wherein the membrane electrode comprises a plurality of primary openings which define a lattice structure, wherein in a first region of the membrane electrode, a plurality of secondary openings is provided relative to the perimeter of each of the primary openings.

14. A MEMS transducer as claimed in claim 13, wherein said first region of the membrane electrode comprises a central region of the membrane electrode.

15. A MEMS transducer as claimed in claim 13, wherein said first region of the membrane electrode overlies a cavity provided in a substrate of the MEMS transducer.

16. A MEMS transducer as claimed in claim 1 wherein the flexible membrane comprises a crystalline or polycrystalline material, such as silicon nitride, and wherein the membrane electrode comprises metal or a metal alloy, such as aluminium alloy.

17. A MEMS transducer comprising:
a membrane electrode comprising a plurality of openings;
a backplate electrode provided in a plane above the membrane and comprising a plurality of holes;
wherein each hole in the backplate electrode is at least partly aligned with a corresponding opening in the membrane electrode,
wherein the membrane electrode comprises a secondary opening which underlies an intermediate section of conductive material formed between two adjacent holes in the backplate electrode.

18. A MEMS transducer comprising:
a flexible membrane comprising a membrane electrode;
wherein the membrane electrode comprises a plurality of primary openings and a plurality of secondary openings
wherein said secondary openings are between said primary openings.

19. An integrated circuit comprising a MEMS transducer as claimed in claim 1 and further comprising readout circuitry.

* * * * *

UNITED STATES PATENT AND TRADEMARK OFFICE
CERTIFICATE OF CORRECTION

PATENT NO. : 10,730,747 B2
APPLICATION NO. : 16/179162
DATED : August 4, 2020
INVENTOR(S) : Jenkins Page 1 of 1

It is certified that error appears in the above-identified patent and that said Letters Patent is hereby corrected as shown below:

In the Specification

1. In Column 7, Line 65, delete "$t_o$," and insert -- $t_0$, --, therefor.

2. In Column 8, Line 1, delete "1.0 μm" and insert -- 10μm --, therefor.

3. In Column 8, Line 13, delete "a" and insert -- σ --, therefor.

4. In Column 8, Line 18, delete "a" and insert -- σ --, therefor.

In the Claims

5. In Column 12, Lines 66-67, in Claim 1, delete "a backplate electrode." and insert -- the backplate electrode. --, therefor.

6. In Column 14, Line 39, in Claim 18, delete "openings" and insert -- openings; and --, therefor.

Signed and Sealed this
Fourth Day of October, 2022

Katherine Kelly Vidal
*Director of the United States Patent and Trademark Office*